United States Patent [19]

Taguchi et al.

[11] Patent Number: 5,589,806

[45] Date of Patent: Dec. 31, 1996

[54] SURFACE ACOUSTIC WAVE FILTER HAVING PARALLEL/SERIAL RESONATOR CONNECTION BASED ON TRANSMITTING AND RECEIVING FREQUENCIES

[75] Inventors: Yutaka Taguchi, Ibaraki; Kazuo Eda, Nara; Shun-ichi Seki, Osaka; Keiji Onishi, Settsu, all of Japan

[73] Assignee: Matsushita Electric Industrial Co., Ltd., Kadoma, Japan

[21] Appl. No.: 368,981

[22] Filed: Jan. 5, 1995

[30] Foreign Application Priority Data

Jan. 12, 1994 [JP] Japan .................................. 6-001476

[51] Int. Cl.$^6$ ..................................................... H03H 9/64
[52] U.S. Cl. ...................... 333/193; 333/195; 310/313 R
[58] Field of Search ................................. 333/193, 194, 333/195, 196; 310/313 R

[56] References Cited

U.S. PATENT DOCUMENTS

| 4,166,258 | 8/1979 | Tseng | 333/195 |
|---|---|---|---|
| 4,580,115 | 4/1986 | Sprengel | 333/194 |
| 4,672,339 | 6/1987 | Zibis et al. | 333/194 |
| 4,673,901 | 6/1987 | Faulkenau et al. | 333/196 |

FOREIGN PATENT DOCUMENTS

| 0422637 | 4/1991 | European Pat. Off. . |
|---|---|---|
| 0541284 | 5/1993 | European Pat. Off. . |
| 52-19044 | 2/1977 | Japan . |
| 58-154917 | 9/1983 | Japan . |
| 63-132515 | 6/1988 | Japan . |
| 3222512 | 10/1991 | Japan . |
| 3278608 | 12/1991 | Japan . |
| 4253414 | 9/1992 | Japan . |
| 613833 | 1/1994 | Japan . |
| 629779 | 2/1994 | Japan . |
| 61783 | 3/1994 | Japan . |

OTHER PUBLICATIONS

U.S. Ser. No. 08/373,033, filed Jan. 17, 1995.
Search Report for European Appl. 95100185.8, mailed Apr. 4, 1995.
Hiteta et al., "Investigation of New Low–Loss & High–Power . . . , " vol. 40, No. 3, May 1993, IEEE Transactions, pp. 224–231.
Ieki et al., "Saw Resonators Using Epitaxially Grown or Electrodes," Proc. 11th Symp. on Ultrasonic Electronics 30 (1991), Suppl. 30–1, pp. 176–178.

Primary Examiner—Benny Lee
Assistant Examiner—David H. Vu
Attorney, Agent, or Firm—Renner, Otto, Boisselle, Sklar

[57] ABSTRACT

A surface acoustic wave filter having a configuration in which a plurality of series surface acoustic wave resonators and parallel surface acoustic wave resonators are connected is used as a receiving filter included in a receiving circuit of a communication apparatus capable of simultaneously transmitting and receiving signals. When the transmitting frequency is higher than the receiving frequency, one of the parallel surface acoustic wave resonator, connected between the signal line and the ground, is disposed most closely to the input terminal of the filter. When the transmitting frequency is lower than the receiving frequency, one of the series surface acoustic wave resonator, connected in series to the signal line, is disposed most closely to the input terminal of the filter. Accordingly, the singular point of the filter is prevented from coinciding with the transmitting frequency, so that the deterioration of the resonator is prevented.

6 Claims, 5 Drawing Sheets

SURFACE ACOUSTIC WAVE FILTER HAVING PARALLEL/SERIAL RESONATOR CONNECTION BASED ON TRANSMITTING AND RECEIVING FREQUENCIES

BACKGROUND OF THE INVENTION

1. Field of the Invention

The present invention relates to a surface acoustic wave filter utilizing a surface acoustic wave resonator. More particularly, the present invention relates to a surface acoustic wave filter which handles signals having a large electric power in a high frequency region.

2. Description of the Related Art

In recent years, intensive study has been positively conducted on a surface acoustic wave device which utilizes a surface acoustic wave, in order to apply the SAW device to a filter (hereinafter "surface acoustic wave" is abbreviated as SAW). SAW filters have been positively developed with the recent development in mobile communications in which signals of higher frequencies are used.

There are some known methods for configuring a filter using a SAW device for a high frequency band, especially for a band of several hundreds of MHz. Typical known methods include, for example: a method for configuring a filter using a plurality of SAW resonators as described in Japanese Laid-Open Patent Publication No. 52-19044; a method for configuring a filter in which each of input and output interdigital transducers of a SAW resonator is divided into a plurality of portions (such a structure is called an interdigitated interdigital transducer structure) as described in Japanese Laid-Open Patent Publication No. 58-154917; and a method for configuring a filter in which SAW resonators are disposed adjacently and capacitively coupled to each other as described in Japanese Laid-Open Patent Publication No. 3-222512.

SAW filters are required to have a smaller size and an improved performance, in accordance with the miniaturization of mobile communication apparatus in recent years. In addition, SAW filters are more often used in various portions of the mobile communication apparatus.

Mobile communication apparatus used in a communication system in which signals are simultaneously transmitted and received has a transmitting circuit and a receiving circuit which are connected to each other. A SAW filter may be used as a receiving filter included in the receiving circuit of the communication apparatus having the above-described configuration. However, if the SAW filter is used for such a purpose, a SAW resonator constituting the SAW filter may be deteriorated in a relatively short period of time. This may disadvantageously result in deterioration of the filter characteristics. Accordingly, there exits a problem in that, if the SAW filter is used as a receiving filter in a communication apparatus capable of simultaneously transmitting and receiving signals, desired advantages cannot be attained.

SUMMARY OF THE INVENTION

According to one aspect of the invention, a surface acoustic wave filter, to be used in a receiving circuit of a communication apparatus capable of simultaneously transmitting a first signal having a predetermined transmitting frequency and receiving a second signal having a predetermined receiving frequency which is lower than the transmitting frequency, includes: an input terminal for receiving an input signal; an output terminal for providing an output signal; and a plurality of surface acoustic wave resonators, wherein the plurality of surface acoustic wave resonators include: at least one series surface acoustic wave resonator connected in series to a signal line connecting the input terminal and the output terminal; and at least two parallel surface acoustic wave resonators each connected between a ground and respective predetermined positions in the signal line, and wherein one of the at least two parallel surface acoustic wave resonators is disposed most closely to the input terminal among the plurality of surface acoustic wave resonators.

According to another aspect of the invention, a surface acoustic wave filter, to be used in a receiving circuit of a communication apparatus capable of simultaneously transmitting a first signal having a predetermined transmitting frequency and receiving a second signal having a predetermined receiving frequency which is higher than the transmitting frequency, includes: an input terminal for receiving an input signal; an output terminal for providing an output signal; and a plurality of surface acoustic wave resonators, wherein the plurality of surface acoustic wave resonators include: at least two series surface acoustic wave resonators each connected in series to a signal line connecting the input terminal and the output terminal; and at least one parallel surface acoustic wave resonator connected between a ground and a predetermined position in the signal line, and wherein one of the at least two series surface acoustic wave resonators is disposed most closely to the input terminal among the plurality of surface acoustic wave resonators.

In one embodiment, each of the plurality of surface acoustic wave resonators is configured using a lithium tantalate substrate.

In another embodiment, an interdigital transducer included in each of the plurality of surface acoustic wave resonators is formed with aluminum which contains copper of 0.5 to 3 wt %.

Thus, the invention described herein makes possible the advantage of providing a SAW filter having filter characteristics which are not deteriorated by the application of electric power outside of its pass band, whereby the SAW filter being applicable to a filter in a receiving circuit of a mobile communication apparatus capable of simultaneously transmitting and receiving signals.

This and other advantages of the present invention will become apparent to those skilled in the art upon reading and understanding the following detailed description with reference to the accompanying figures.

DESCRIPTION OF THE PREFERRED EMBODIMENTS

Prior to the description of examples according to the invention, results of a study conducted by the inventors of the present invention for solving the above-mentioned problems in the related art are first explained. In the following explanation, a resonator-type filter which is constituted of a plurality of SAW resonators is employed.

Figure 1:
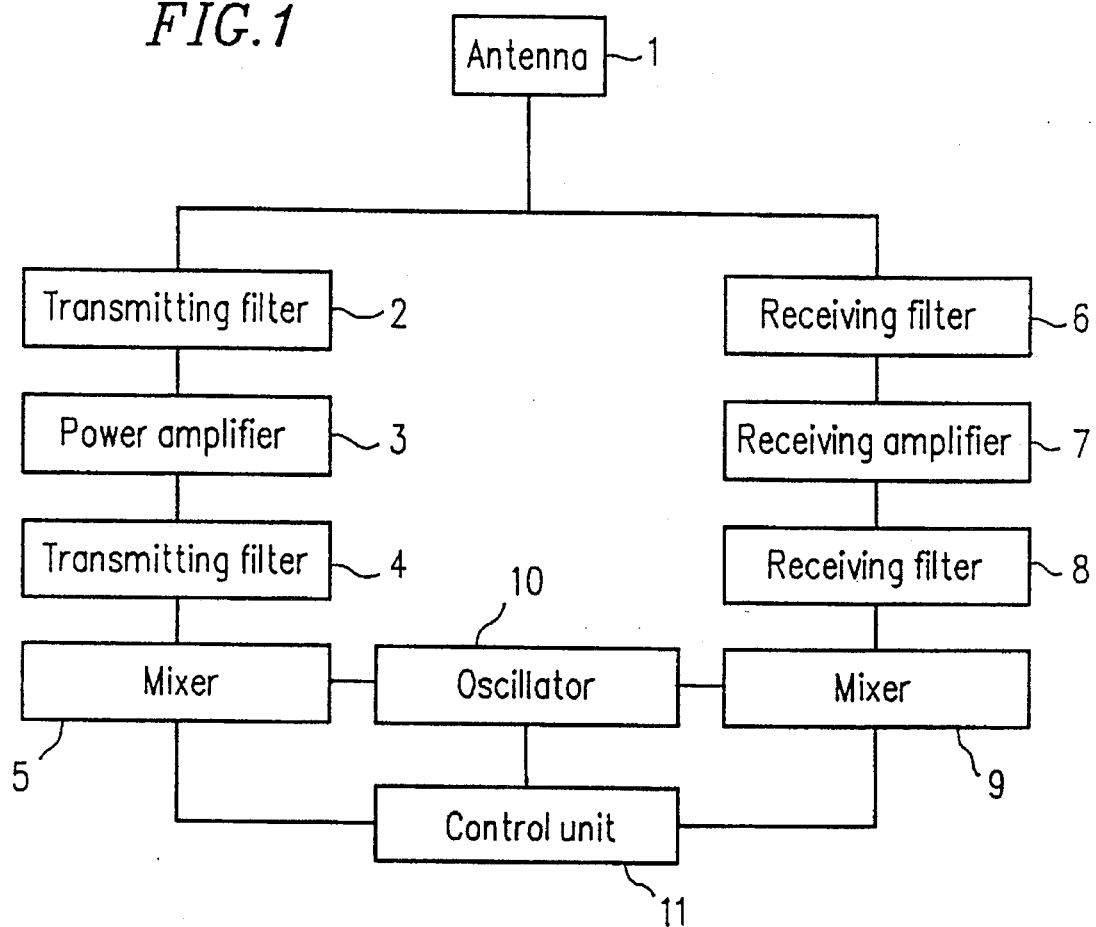
FIG. 1 is a block diagram schematically showing an exemplary configuration of a transmitting circuit and a receiving circuit in a mobile communication apparatus capable of simultaneously transmitting and receiving signals.

FIG. 1 is a block diagram schematically showing an exemplary configuration of a transmitting circuit and a receiving circuit for high-frequency signals in a mobile communication apparatus capable of simultaneously transmitting and receiving signals.

In the configuration shown in FIG. 1, a high-frequency transmitting signal generated in an oscillator 10 is conveyed through a mixer 5, a first transmitting filter 4, a power amplifier 3, and a second transmitting filter 2 included in a transmitting circuit and then transmitted from an antenna 1. On the other hand, a high-frequency signal received at the antenna 1 is fed through a second receiving filter 6, a receiving amplifier 7, a first receiving filter 8, and a mixer 9 included in a receiving circuit. A control unit 11 controls the operation of these transmitting and receiving circuits.

In the configuration shown in FIG. 1, SAW filters are mainly used as, as for example, the first transmitting filter 4 functioning as an inter-stage filter in the transmitting circuit, the first receiving filter 8 functioning as an inter-stage filter in the receiving circuit, the second transmitting filter 2 functioning as an output filter of the oscillator 10. Furthermore, a SAW filter may be used as the second receiving filter 6 corresponding to an initial stage input of the receiving circuit.

In the configuration shown in FIG. 1, the receiving circuit and the transmitting circuit are connected to each other. Accordingly, a transmitting signal is transmitted to the outside through the antenna 1 and also is applied to circuit elements constituting the receiving circuit, especially to the second receiving filter 6 which is disposed most closely to the antenna 1. It is considered that most of the transmitting signals applied to the receiving circuit are reflected by the SAW resonator which constitutes the second receiving filter 6.

In general, a transmitting signal has a relatively large electric power. In addition, the frequency of the transmitting signal generally exists outside of the pass band of the SAW filter serving as the second receiving filter 6. Accordingly, the transmitting signal which is to be applied to the second receiving filter 6 is an out-of-band applied electric power for the SAW filter serving as the second receiving filter 6, when applied thereto.

At this time, if the transmitting signal, i.e., the out-of-band applied electric power has a frequency coinciding with a singular point of the SAW resonator, that is, a frequency corresponding to the resonance frequency or the antiresonance frequency of the SAW resonator, the electric power seriously adversely affects the durability of the SAW resonator. The reasons are explained with reference to FIG. 2.

Figure 2:
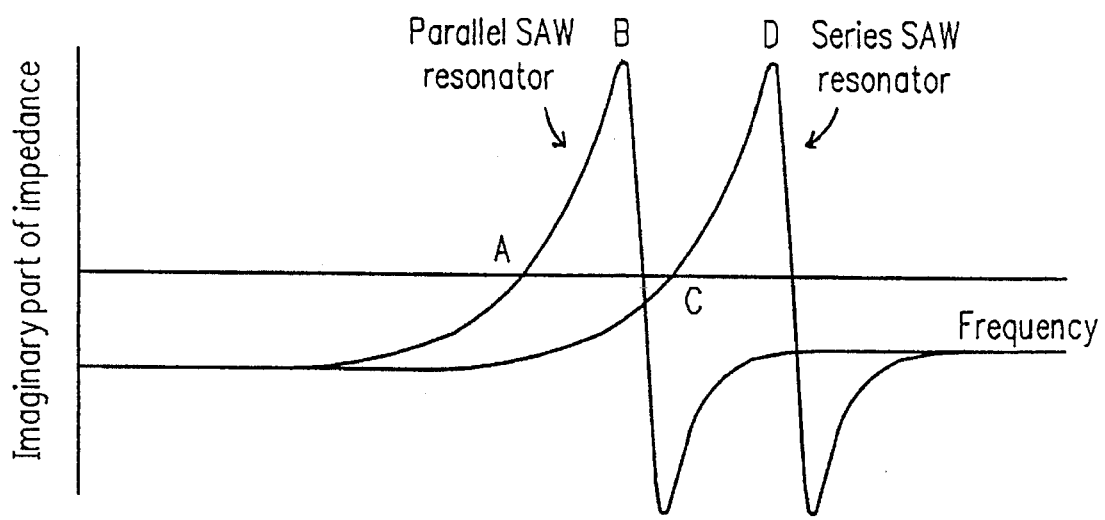
FIG. 2 is a graph schematically showing the relationship between an impedance (imaginary part) and a frequency of series/parallel SAW resonators which constitute a resonator-type filter.

FIG. 2 shows the relationship between an impedance (imaginary part) and a frequency for a series SAW resonator and a parallel SAW resonator which constitute the resonator-type filter. In FIG. 2, point B on an impedance curve for the parallel SAW resonator indicates the antiresonance frequency of the parallel SAW resonator. Similarly, point C on an impedance curve for the series SAW resonator indicates the resonance frequency thereof. The frequency region between the points B and C corresponds to the pass band of the SAW filter constituted by the series and parallel SAW resonators.

In the second receiving filter 6, when a parallel SAW resonator, which is connected between a signal line and a ground, is disposed most closely to the antenna 1, a resonance point (point A in FIG. 2) as the singular point exists in a frequency region lower than the pass band. At the resonance point A, the impedance is close to 0, so that a large current flows through the parallel SAW resonator. Accordingly, when a signal having a frequency around the resonance point A is applied to the parallel SAW resonator, the parallel SAW resonator may be deteriorated by the large current.

Alternatively, in the second receiving filter 6, when a series SAW resonator, which is connected in series to a signal line, is disposed most closely to the antenna 1, an antiresonance point (point D in FIG. 2) as the singular point exists in a frequency region higher than the pass band. At the antiresonance point D, the impedance is very large, so that a large voltage is applied to the series SAW resonator. Accordingly, when a signal having a frequency around the antiresonance point D is applied to the series SAW resonator, the series SAW resonator may be deteriorated by the large voltage.

In view of the above study, the inventors found that in a desired filter configuration, the singular point of the SAW resonator used in the second receiving filter 6 shown in FIG. 1 should be prevented from coinciding with the frequency of the transmitting signal in order to prevent the deterioration of the SAW resonator.

Specifically, in the case where a transmitting frequency is higher than a receiving frequency, that is, in the case where a transmitting signal to be an out-of-band electric power applied to the second receiving filter 6 has a frequency higher than the pass band of the second receiving filter 6, the second receiving filter 6 is configured in such a manner that a particular SAW resonator disposed most closely to the input terminal is connected between the signal line and the ground, so as to form a parallel resonator. On the contrary, in the case where the transmitting frequency is lower than the receiving frequency, that is, in the case where the transmitting signal to be an out-of-band electric power applied to the second receiving filter 6 has a frequency lower than the pass band of the second receiving filter 6, the second receiving filter 6 is configured in such a manner that a particular SAW resonator disposed most closely to the input terminal is connected in series to the signal line, so as to form a series resonator.

Hereinafter, examples of the invention which are conducted based on the above study will be described with reference to the relevant figures.

EXAMPLE 1

Figure 3:
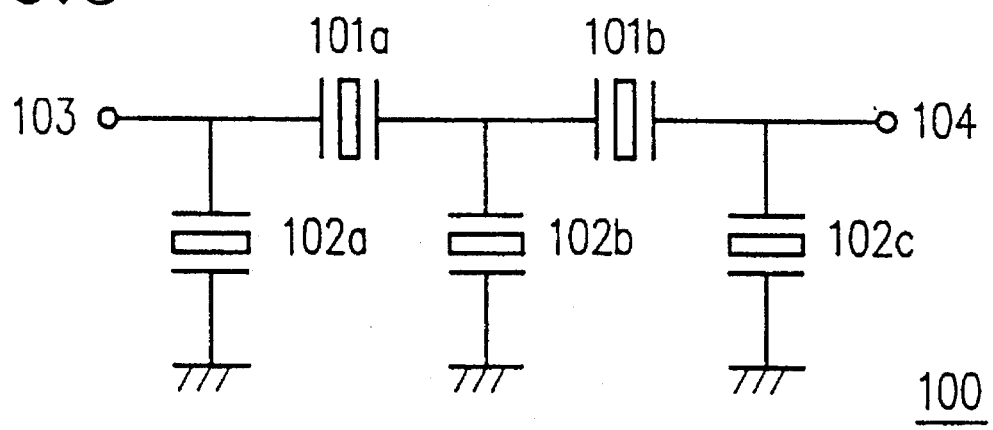
FIG. 3 is a diagram schematically showing the configuration of a SAW filter in a first example according to the invention.

FIG. 3 schematically shows the configuration of a SAW filter 100 in a first example according to the invention. The SAW filter 100 in this example is used in the case where the transmitting frequency is higher than the receiving frequency, that is, in the case where the transmitting signal to be an out-of-band electric power applied to the second receiving filter 6 has a frequency higher than the pass band of the second receiving filter 6.

The SAW filter 100 includes two series SAW resonators 101a and 101b connected in series to a signal line connecting an input terminal 103 and an output terminal 104, and three parallel SAW resonators 102a, 102b and 102c connected between the signal line and a ground. Among the parallel SAW resonators, the first parallel SAW resonator 102a is connected between a node of the input terminal 103 and the first series SAW resonator 101a, and the ground. Similarly, the second parallel SAW resonator 102b is connected between a node of the first series SAW resonator 101a and the second series SAW resonator 101b, and the ground. The third parallel SAW resonator 102c is connected between a node of the second series SAW resonator 101b and the output terminal 104, and the ground.

Accordingly, in the SAW filter 100 in this example used in the scheme in which the transmitting frequency is higher than the receiving frequency, the SAW resonator which is disposed most closely to the input terminal 103 is the first parallel SAW resonator 102a.

Figure 4:
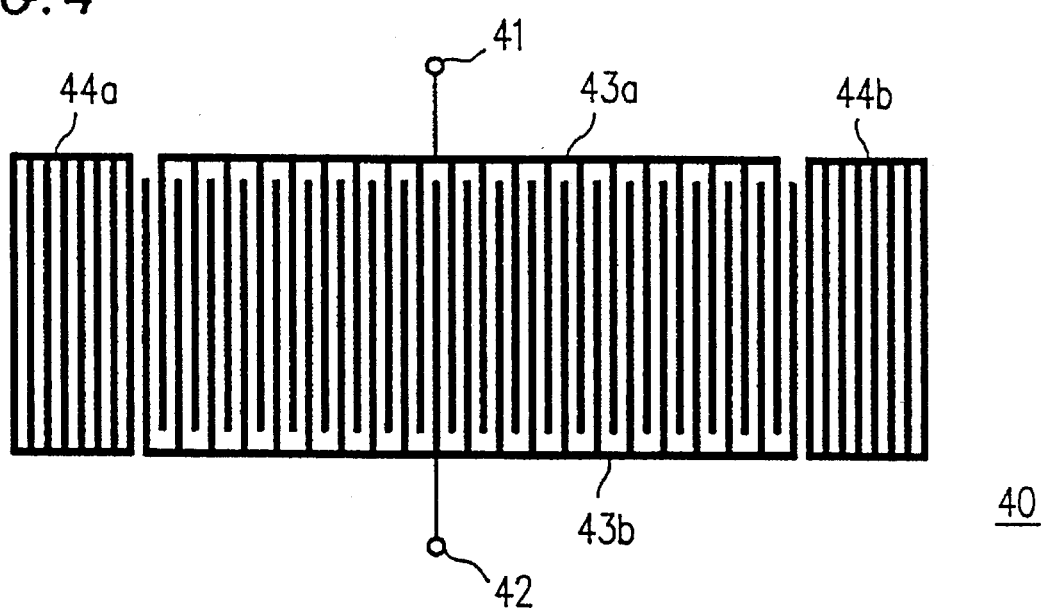
FIG. 4 is a diagram showing an exemplary configuration of a SAW resonator used in the SAW filter according to the invention.

FIG. 4 shows an exemplary configuration of each of the SAW resonators 101a, 101b, 102a, 102b and 102c. A SAW resonator 40 shown in FIG. 4 has a configuration in which two interdigital transducers (hereinafter referred to as IDTs) 43a and 43b which are coupled to each other are interposed between two reflectors 44a and 44b. The IDT 43a is connected to an input terminal 41 and the IDT 43b is connected to an output terminal 42. When the SAW resonator 40 is to be formed, a pure aluminum film is deposited on a surface of a 36° Y-cut X-propagation lithium tantalate substrate by sputtering in a predetermined pattern. Thus, the IDTs 43a and 43b, and the reflectors 44a and 44b are formed.

The fabrication method of the IDTs 43a and 43b and the reflectors 44a and 44b is not limited to that described above. A material other than pure aluminum can be used. The SAW resonator 40 can be formed on a substrate of another type, such as 41° Y-cut X-propagation lithium niobate substrate. Moreover, disposing all SAW resonators, included in one filter, on one and the same substrate is advantageous in terms of the simplification of the fabrication process and a reduction in statistic variation of characteristics between the respective SAW resonators.

The configuration and the fabricating method of the SAW resonator 40, or the characteristics of the SAW resonator 40 are well known, so that the detailed descriptions thereof are omitted.

In the case where the SAW resonator 40 having the configuration shown in FIG. 4 is used for the series SAW resonators 101a and 101b in the SAW filter 100 shown in FIG. 3, typical design parameters are as follows: the number of IDT pairs is 100; the pitch of the IDTs is 1.101 μm; a length of aperture of the IDTs is 50 μm; and the number of branches of the reflector is 50. In the case where the SAW resonator 40 having the configuration shown in FIG. 4 is used for the parallel SAW resonators 102a, 102b and 102c in the SAW filter 100 shown in FIG. 3, typical design parameters are as follows: the number of IDT pairs is 100; the pitch of the IDTs is 1.155 μm; the length of aperture of the IDTs is 130 μm; and the number of branches of the reflector is 50. For either of the series or the parallel SAW resonators, the thickness of the pure aluminum film is set to be 4100 Å. Accordingly, in the SAW filter 100 shown in FIG. 3, the pass band of the filter can be set to about 858 MHz to 887 MHz, and the central frequency of the pass band can be set to about 872 MHz. It is appreciated that the above values are only examples, and another configuration with other values can be realized.

In order to confirm the advantages attained by the SAW filter 100 having the above-described configuration, a signal having a frequency of 917 MHz, which is higher than the central frequency of the pass band by about 45 MHz, and an electric power of 4 W is applied to the SAW filter 100 at an ambient temperature of 100° C. for 200 hours. As a result, no deterioration was observed in the filter characteristics such as a pass characteristic, a reflection characteristic, in the SAW filter 100 having the configuration shown in FIG. 3, after the elapse of 200 hours.

In the above description, two series SAW resonators and three parallel SAW resonators constitute the SAW filter 100 of this example. However, the number of series and parallel SAW resonators are not limited by these specific values. In order to attain the advantages of this example, a SAW filter may have at least one series SAW resonator and at least two parallel SAW resonators, as long as these SAW resonators are disposed so as to satisfy the above-described positional relationship. Alternatively, a larger number of series SAW resonators and a larger number of parallel SAW resonators can be connected.

EXAMPLE 2

Figure 5:
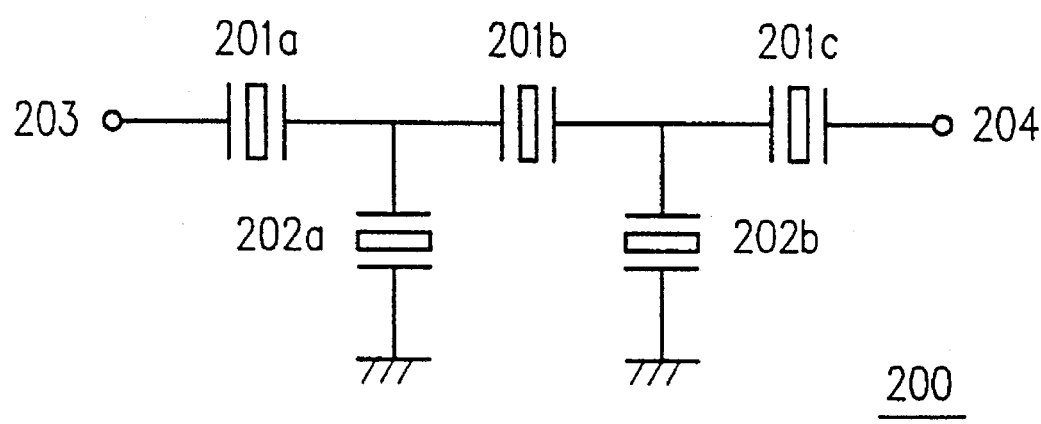
FIG. 5 is a diagram schematically showing the configuration of a SAW filter in a second example according to the invention.

FIG. 5 schematically shows the configuration of a SAW filter 200 in a second example according to the invention. The SAW filter 200 in this example is used in the case where the transmitting frequency is lower than the receiving frequency, that is, in the case where the transmitting signal to be an out-of-band electric power applied to the second receiving filter 6 has a frequency lower than the pass band of the second receiving filter 6.

The SAW filter 200 includes three series SAW resonators 201a, 201b and 201c connected in series to a signal line between an input terminal 203 and an output terminal 204, and two parallel SAW resonators 202a and 202b connected between the signal line and a ground. The first parallel SAW resonator 202a is connected between a node of the first series SAW resonator 201a and the second series SAW resonator 201b, and the ground. Similarly, the second parallel SAW resonator 202b is connected between a node of the second series SAW resonator 201b and the third series SAW resonator 201c, and the ground.

Accordingly, in the SAW filter 200 in this example used in the scheme in which the transmitting frequency is lower than the receiving frequency, the SAW resonator which is disposed most closely to the input terminal 203 is the first series SAW resonator 201a.

The respective SAW resonators 201a, 201b, 201c, 202a and 202b are configured as shown in FIG. 4 as in the first example. Accordingly, the detailed descriptions on the fabrication process and the configuration, or the characteristics are omitted here.

In the case where the SAW resonator 40 having the configuration shown in FIG. 4 is used for the series SAW resonators 201a, 201b and 201c in the SAW filter 200 shown in FIG. 5, typical design parameters are as follows: the number of IDT pairs is 100; the pitch of the IDTs is 1.101 μm; a length of aperture of the IDTs is 50 μm; and the number of branches of the reflector is 50. In the case where the SAW resonator 40 having the configuration shown in FIG. 4 is used for the parallel SAW resonators 202a and 202b in the SAW filter 200 shown in FIG. 5, typical design parameters are as follows: the number of IDT pairs is 100; the pitch of the IDTs is 1.155 μm; the length of aperture of the IDTs is 130 μm; and the number of branches of the reflector is 50. For either of the series or the parallel SAW resonators, the thickness of the pure aluminum film is set to be 4100 Å. Accordingly, similar to the SAW filter 100 in the first example, in the SAW filter 200 shown in FIG. 5, the pass band of the filter can be set to about 858 MHz to 887 MHz, and the central frequency of the pass band can be set to about 872 MHz. It is appreciated that the above values are only examples, and another configuration with other values can be realized.

In order to confirm the advantages attained by the SAW filter 200 having the above-described configuration, a signal having a frequency of 827 MHz, which is lower than the central frequency of the pass band by about 45 MHz, and an electric power of 4 W is applied to the SAW filter 200 at an ambient temperature of 100° C. for 200 hours. As a result, no deterioration is observed in the filter characteristics such as a pass characteristic, a reflection characteristic, and the like, in the SAW filter 200 having the configuration shown in FIG. 5 after the elapse of 200 hours.

In the above description, three series SAW resonators and two parallel SAW resonators constitute the SAW filter 200 of this example. However, the number of series and parallel SAW resonators are not limited by these specific values. In order to attain the advantages of this example, a SAW filter may have at least two series SAW resonators and at least one parallel SAW resonator, as long as these SAW resonators are disposed so as to satisfy the above-described positional relationship. Alternatively, a larger number of series SAW resonators and a larger number of parallel SAW resonators can be connected.

The advantages of the SAW filters 100 and 200 which are described in the first and second examples, respectively, can be further verified by the following comparative study. The signal described in the second example, having a frequency of 827 MHz which is lower than the center frequency of the pass band by about 45 MHz and an electric power of 4 W, is applied, at an ambient temperature of 100° C. for 200 hours, to the SAW filter 100 having the configuration of FIG. 3 described in the first example. Similarly, the signal described in the first example, having a frequency of 917 MHz which is higher than the central frequency of the pass band by about 45 MHz and an electric power of 4 W, is applied, at an ambient temperature of 100° C. for 200 hours, to the SAW filter 200 having the configuration of FIG. 5 described in the second example. In both comparative examples, it is observed that the filter characteristics are deteriorated. Consequently, the results of the study conducted by the inventors which are described prior to the description of the examples are proved to be proper, and it is confirmed that the advantages of the configurations of the SAW filters described as the first and second examples can be attained in the condition that the respective specific relationships in frequency are satisfied.

EXAMPLE 3

In this example, aluminum which contains copper of 1 wt % is used as the material for the IDTs and the reflectors in the SAW resonators, instead of the pure aluminum used in the first and second examples. The configuration of each SAW resonator is the same as that shown in FIG. 4 and described in the first and second examples, so that the detailed description thereof is omitted.

Also in this example, as in the first example, a SAW filter having the configuration shown in FIG. 3 is configured. Specifically, the SAW resonator disposed most closely to the input terminal through which a signal is applied to the filter is the parallel SAW resonator. The design parameters of each SAW resonator are selected as described in the previous examples so that the pass band of the filter is about 858 MHz to 887 MHz, and the central frequency of the pass band is about 872 MHz.

In order to confirm the advantages attained by the SAW filter of this example, a signal having a frequency of 917 MHz which is higher than the central frequency of the pass band by about 45 MHz and an electric power of 4 W is applied to the SAW filter at an ambient temperature of 100° C. for 200 hours. As a result, it is confirmed that good filter characteristics are maintained for a longer period of time in this example where aluminum which contains copper of 1 wt % is used as the electrode material, as compared with the first example where the pure aluminum is used for this purpose.

In another example, the content of copper is varied. When aluminum which contains copper of 0.5 to 3 wt % is used, similar advantages can be attained as in the case where aluminum which contains copper of 1 wt % is used. However, if the content of copper is lower than 0.5 wt %, the advantages cannot be attained. If the content of copper is higher than 3 wt %, serious deterioration of filter characteristics occurs due to the increase in electric resistance.

As described above, the advantages of the SAW filter of the invention can be further improved by enhancing durability thereof by using aluminum which contains copper of 0.5 to 3 wt % as a material for the IDTs and reflectors of the SAW resonators. In the above, the case where the SAW resonator connected most closely to the input terminal of the filter is the parallel SAW resonator as in the first example is described. It is appreciated that the same advantages can be attained in the case where the SAW resonator connected most closely to the input terminal of the filter is the series SAW resonator as in the second example.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A surface acoustic wave filter to be used in a receiving circuit of a communication apparatus configured for simultaneously transmitting a first signal having a predetermined transmitting frequency and receiving a second signal having a predetermined receiving frequency which is lower than the transmitting frequency, the surface acoustic wave filter comprising:

an input terminal for receiving an input signal;

an output terminal for providing an output signal; and a plurality of surface acoustic wave resonators, wherein the plurality of surface acoustic wave resonators include: at least one series surface acoustic wave resonator connected in series to a signal line connecting the input terminal and the output terminal; and at least two parallel surface acoustic wave resonators each connected between a ground and respective predetermined positions in the signal line, and wherein one of the at least two parallel surface acoustic wave resonators is disposed most closely to the input terminal among the plurality of surface acoustic wave resonators.

2. A surface acoustic wave filter according to claim 1, wherein each of the plurality of surface acoustic wave resonators is configured using a lithium tantalate substrate.

3. A surface acoustic wave filter according to claim 1, wherein an interdigital transducer included in each of the plurality of surface acoustic wave resonators is formed with aluminum which contains copper of 0.5 to 3 wt %.

4. A surface acoustic wave filter to be used in a receiving circuit of a communication apparatus configured for simultaneously transmitting a first signal having a predetermined transmitting frequency and receiving a second signal having a predetermined receiving frequency which is higher than the transmitting frequency, the surface acoustic wave filter comprising:

an input terminal for receiving an input signal;

an output terminal for providing an output signal; and a plurality of surface acoustic wave resonators, wherein the plurality of surface acoustic wave resonators include: at least two series surface acoustic wave resonators each connected in series to a signal line connecting the input terminal and the output terminal; and at least one parallel surface acoustic wave resonator connected between a ground and a predetermined position in the signal line, and wherein one of the at least two series surface acoustic wave resonators is disposed most closely to the input terminal among the plurality of surface acoustic wave resonators.

5. A surface acoustic wave filter according to claim 4, wherein each of the plurality of surface acoustic wave resonators is configured using a lithium tantalate substrate.

6. A surface acoustic wave filter according to claim 4, wherein an interdigital transducer included in each of the plurality of surface acoustic wave resonators is formed with aluminum which contains copper of 0.5 to 3 wt %.

* * * * *